United States Patent [19]
Ohtoshi et al.

[11] Patent Number: 5,170,404
[45] Date of Patent: Dec. 8, 1992

[54] SEMICONDUCTOR LASER DEVICE SUITABLE FOR OPTICAL COMMUNICATIONS SYSTEMS DRIVE

[75] Inventors: Tsukuru Ohtoshi, Kokubunji; Shinji Sasaki, Komoro; Naoki Chinone, Chofu; Kazuhisa Uomi; Shinji Sakano, both of Hachioji, all of Japan

[73] Assignee: Hitachi, Ltd., Tokyo, Japan

[21] Appl. No.: 576,607

[22] Filed: Aug. 31, 1990

[30] Foreign Application Priority Data

Sep. 4, 1989 [JP] Japan ................................. 1-227348
Nov. 27, 1989 [JP] Japan ................................. 1-304606

[51] Int. Cl.$^5$ ............................................. H01S 3/19
[52] U.S. Cl. .......................................... 372/46; 372/45
[58] Field of Search ............................ 372/44, 45, 46

[56] References Cited

U.S. PATENT DOCUMENTS

| | | | |
|---|---|---|---|
| 4,905,057 | 2/1990 | Ohishi et al. | 372/46 |
| 4,910,744 | 3/1990 | Yoshida et al. | 372/46 |
| 4,977,568 | 12/1990 | Yamamoto et al. | 372/46 |

FOREIGN PATENT DOCUMENTS 51-13588  2/1976  Japan.
62-216386 9/1987  Japan.
63-133587 6/1988  Japan.

OTHER PUBLICATIONS

*IEEE Journal of Quantum Electronics*, vol. 25, No. 6, pp. 1362-1368, Jun. 1989.
IEEE Journal of Quantum Electronics, vol. QE-25, No. 6, pp. 1362-1368, June 6, 1989, S. Asada et al.
Journal of Crystal Growth, vol. 27, pp. 118-124, (1974), J. W. Matthews and A. E. Blakeslee, Defects in Epitaxial Multilayers, North Holland Publishing Co.
Heterostructure Materials, Part B, by H. C. Casey and M. B. Panish, pp. 42-47.

*Primary Examiner*—James W. Davie
*Attorney, Agent, or Firm*—Kenyon & Kenyon

[57] ABSTRACT

Disclosed in a semiconductor laser device for use in a system or apparatus utilizing light for information transmission in optical communication or the like, in which lattice defects or the like are prevented from occurring in the vicinity of a light-emitting active area to thereby reduce a leakage current which substantially makes no contribution to light emission. In order to realize the above semiconductor laser device, a wide gap area for preventing a leakage current is formed to be flat or formed to be spatially apart from the active area.

21 Claims, 8 Drawing Sheets

SEMICONDUCTOR LASER DEVICE SUITABLE FOR OPTICAL COMMUNICATIONS SYSTEMS DRIVE

BACKGROUND OF THE INVENTION

The present invention relates to a semiconductor laser device suitable for use in a system or apparatus, such as an optical communication system or the like, in which information transmission/reception is executed by use of light.

As semiconductor laser devices used for optical communication or the like, there are buried heterostructure (BH) laser devices having semi-insulating current blocking layers. A laser device in which a current blocking layer is provided to reduce a leakage current not contributing to light emission to thereby reduce the oscillation threshold is shown in a paper by S. Asada et al., in "IEEE Journal of Quantum Electronics", vol. QE-25, pages 1362-1368, (1989). In short, shown is a BH laser in which InGaP layers each constituted by a strained semiconductor having a forbidden band gap wider than that of InP are provided on a substrate and in side walls of a mesa.

On the other hand, known are buried crescent lasers, BH lasers and the like, having a current blocking layer formed by stacking p-type InP layers and n-type InP layers alternately to reduce a leakage current JP-A-51-13588.

SUMMARY OF THE INVENTION

In the BH laser proposed by S. Asada et al., an InGaP layer composed of a strained semiconductor is provided also in the side portion of the mesa. In such a configuration of the BH laser, the degree of growing of crystalline film is poor both in the mesa side portion and in the corner portion between the mesa and the substrate. Further, controlling film thickness was found to be difficult.

In the laser in which p-type and n-type semiconductor layers are stacked alternately as a current blocking layer, a problem to be solved exists in that the quantity of reduction of a leakage current is small.

In the conventional BH laser and the conventional BC laser, a leakage current component increases at a high temperature to reduce the light emission efficiency. Accordingly, in general, the temperature suitable for use of the laser is limited to about 80° C. Thus, there arises a problem in that the laser is unsuitable for practical use.

An object of the present invention is therefore to solve the problems in the prior art.

Another object of the invention is to provide a semiconductor laser structure in which oscillation can be established with high efficiency even under the condition of a relatively high temperature.

To attain the foregoing objects, the present invention has the following features.

That is, according to an aspect of the present invention, the semiconductor laser device comprises: a semiconductor substrate; a first semiconductor region being arranged on the semiconductor substrate and including an active area which has a first forbidden band gap for emitting light according to an injected electric current; a second semiconductor region being provided adjacent to the first semiconductor region, having a smaller refractive index than that of the active area to keep the light emitted from the active area in the vicinity of the active area, and having a second forbidden band gap larger than the first forbidden band gap; a pair of electrodes for injecting an electric current into the first semiconductor region; the second semiconductor region including a third semiconductor region for blocking the electric current injected through the pair of electrodes so as not to pass the electric current through the second semiconductor region, the third semiconductor region having a third forbidden band gap larger than the second forbidden band gap and being formed substantially to be flat. By making the third semiconductor region for blocking a current substantially flat and by eliminating the corner portions of the third semiconductor region, occurrence of crystal defects can be prevented, so that the film thickness controlling property can be improved. In particular, the forbidden band level caused by transition or the like in the inside of the current blocking layer is eliminated effectively, so that deterioration of the current blocking function is prevented.

According to another aspect of the invention, the semiconductor laser device comprises: a semiconductor substrate; a first semiconductor region being arranged on the semiconductor substrate and including an active area which has a first forbidden band gap for emitting light according to an injected electric current; a second semiconductor region being provided adjacent to the first semiconductor region, having a smaller refractive index than that of the active area to keep the light emitted from the active area in the vicinity of the active area, and having a second forbidden band gap larger than the first forbidden band gap; a pair of electrodes for injecting an electric current into the first semiconductor region; the second semiconductor region having a third semiconductor region for blocking the electric current injected through the pair of electrodes so as not to pass the electric current through the second semiconductor region, the third semiconductor region having a third forbidden band gap larger than the second forbidden band gap and being formed so as to be apart from the active area. If the third semiconductor region for effectively blocking the current in the forbidden band gap is brought into contact with the active area having a smaller forbidden band gap, the aforementioned defects caused by transition or the like occur in the active area so that a sufficient forbidden band gap cannot be ensured.

According to a restricted aspect of the invention, in the semiconductor laser device, the third semiconductor region as defined above is formed of a semiconductor material having a lattice constant different from the lattice constant of the semiconductor substrate as defined above. In general, the third semiconductor region (so-called strained layer) has a tendency to bring lattice defects. According to the aspect of the invention, a particularly preferable effect is in that the range of selection of the semiconductor material having such a larger forbidden band gap as to be used in the third semiconductor region can be enlarged.

Figure 2:
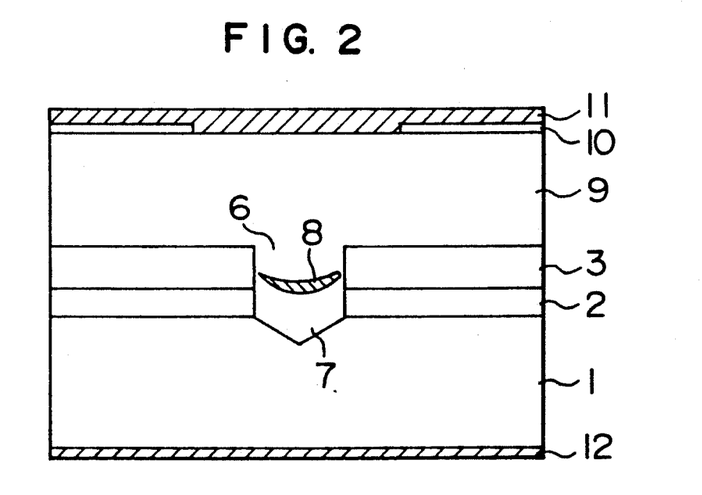
FIG. 2 is a sectional view of a conventional BC laser.

FIG. 2 is a sectional view of a conventional BC-type laser. In the structure as shown in FIG. 2, at a high temperature, electrons are injected from an n-InP clad layer 9 into an n-InP current blocking layer 2 through a p-InP current blocking layer 3, so that a leakage current increases.

Figure 1:
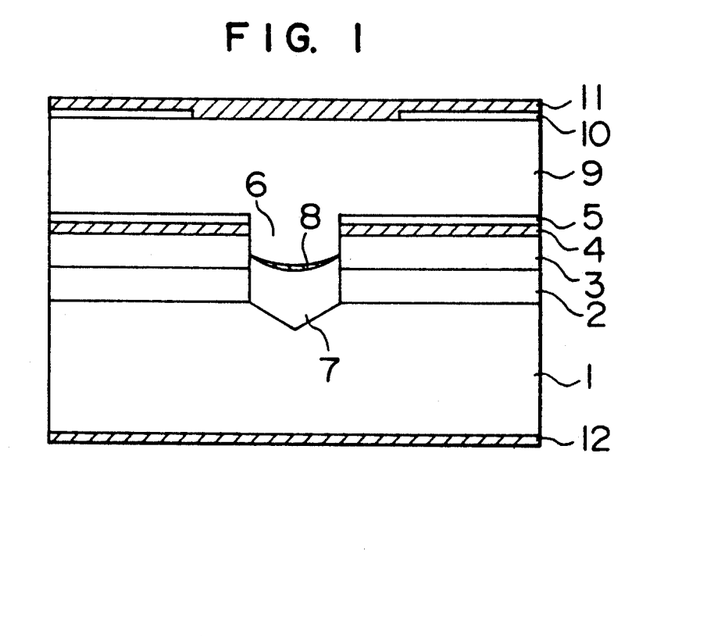
FIGS. 1, 9, 10, 11(a)–11(d), 12 and 13 are sectional views showing various embodiments of the semiconductor laser according to the present invention.

In the structure of the invention as shown in FIG. 1, a semiconductor layer or a strained-layer superlattice (4 in the drawing) having a forbidden band gap larger than that of InP is introduced to block the injection of electrons from the n-InP clad layer 9 into the n-InP current blocking layer 2. As a result, even at a high temperature, the leakage current component is sufficiently small to attain a high-efficient laser operation.

Examples of Groups III-V semiconductor materials having a forbidden band gap larger than that of InP include $(Al_xGa_{1-x})_yIn_{1-y}As$, $(Al_xGa_{1-x})_yIn_{1-y}P$, etc.

Figure 3:
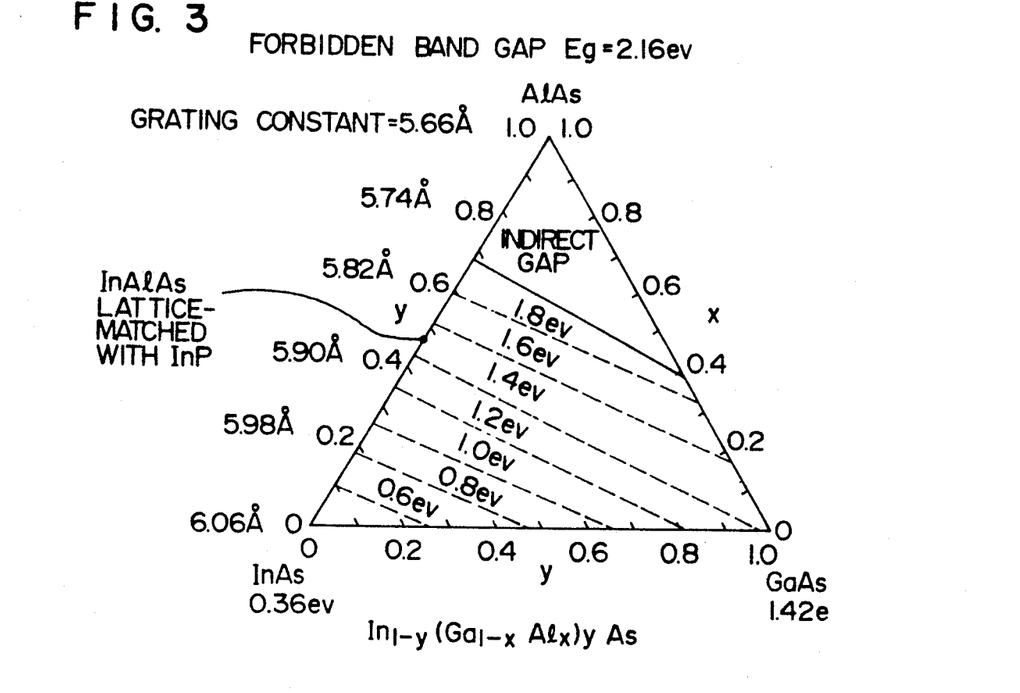
FIG. 3 is a map view showing the relationship between forbidden band gap and lattice constant of $(Al_{x}Ga_{1-x})_{y}In_{1-y}As$.
Figure 4:
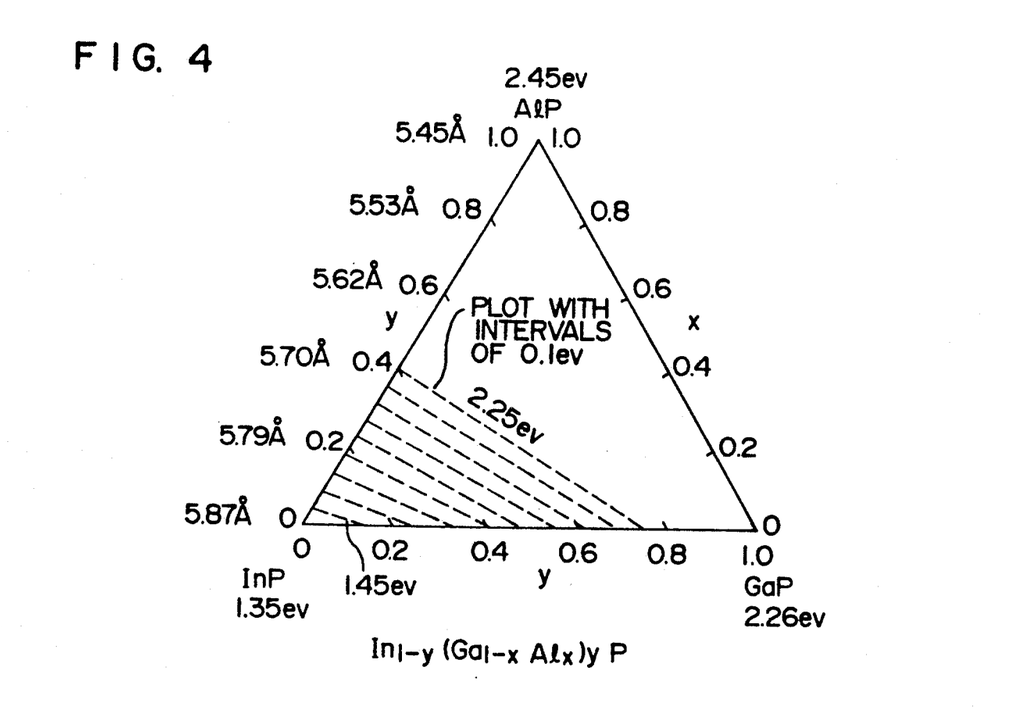
FIG. 4 is a map view showing the relationship between forbidden band gap and lattice constant of $(Al_{x}Ga_{1-x})_{y}In_{1-y}P$.

FIGS. 3 and 4 are cited from the reading by H. C. Casey and M. B. Panish, "Heterostructure Lasers", Part B, p.p. 44-45. That shown in FIGS. 3 and 4 has dependency on a forbidden band gap and a lattice constant for each of the compositions $(Al_xGa_{1-x})_yIn_{1-y}As$ and $(Al_xGa_{1-x})_yIn_{1-y}P$.

In FIG. 3, a range of lattice-matching with InP is shown by a dotted line. In the case of $x=1$ and $y \approx 0.48$, that is, in the case of $In_{0.52}Al_{0.48}As$, the forbidden band gap takes a maximum value of about 1.50 eV. It is apparent from this fact that the maximum value is larger than the forbidden band gap of InP of 1.35 eV by about 0.15 eV. In the case of $y \geq 0.48$ in the structural formula $In_{1-y}Al_yAs$, the forbidden band gap can be widened more greatly though lattice mismatching occurs. The lattice-mismatching $In_{1-y}Al_yAs$ can grow with no occurrence of defects, when it is formed as a strained-layer superlattice in which thickness in each of the layers is not more than about 10 nm.

In FIG. 4, shown is $(Al_xGa_{1-x})_yIn_{1-y}P$. In general, a composition having a forbidden band gap wider than that of InP is lattice-mismatched with InP. However, the problem can be solved by forming the composition as a strained-layer superlattice.

Figure 5:
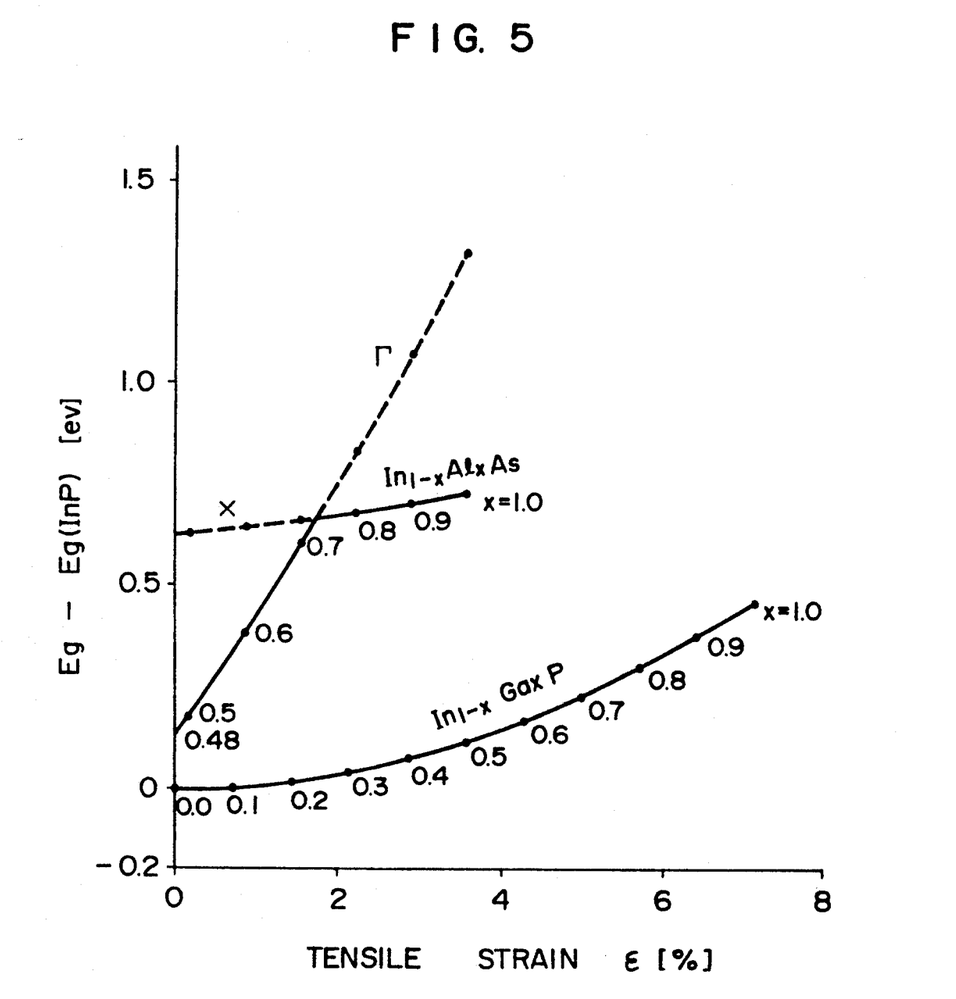
FIG. 5 is a calculational view showing the relationship of tensile strain with difference between the forbidden band gap of each of InAlAs and InGaP and the forbidden band gap of InP.
Figure 6:
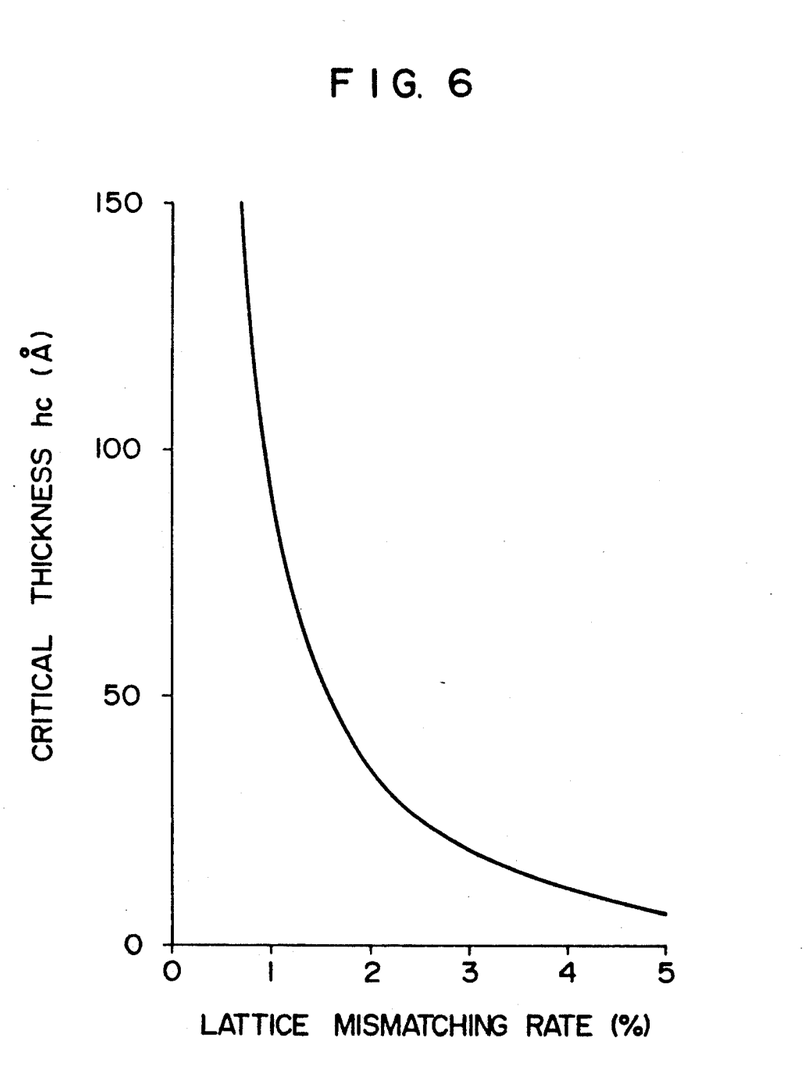
FIG. 6 is a calculational view showing the relationship between lattice-mismatching rate and critical film thickness with respect to InP.

FIG. 5 shows calculated values in an orthogonal coordinate system with the difference between the band gap Eg of $In_{1-x}Al_xAs$ (or $In_{1-x}Ga_xP$) and the band gap of InP as the abscissa and the tensile strain (distortion) in the case where it grows on a semiconductor having the grating constant of InP as the ordinate. In FIG. 5, both the change of the band gap and the separation into the heavy hole band and the light hole band, which are caused by strain, are considered. In general, InGaP is found to be disadvantageous relative to InAlAs. This is because in InGaP, the band gap increasing rate due to the change of the composition is small, and in GaP, the grating constant is small and the strain is large. On the other hand, FIG. 6 shows the relationship between lattice-mismatching rate and critical thickness hc with respect to InP, calculated according to the model of Matthews et al., described in "Journal of Crystal Growth", vol. 27, pages 118-125, 1974. Although the model does not always agree with experiments, it is apparent that use of a semiconductor having 4% or more lattice-mismatching rate as a single layer is undesirable.

Figure 7:
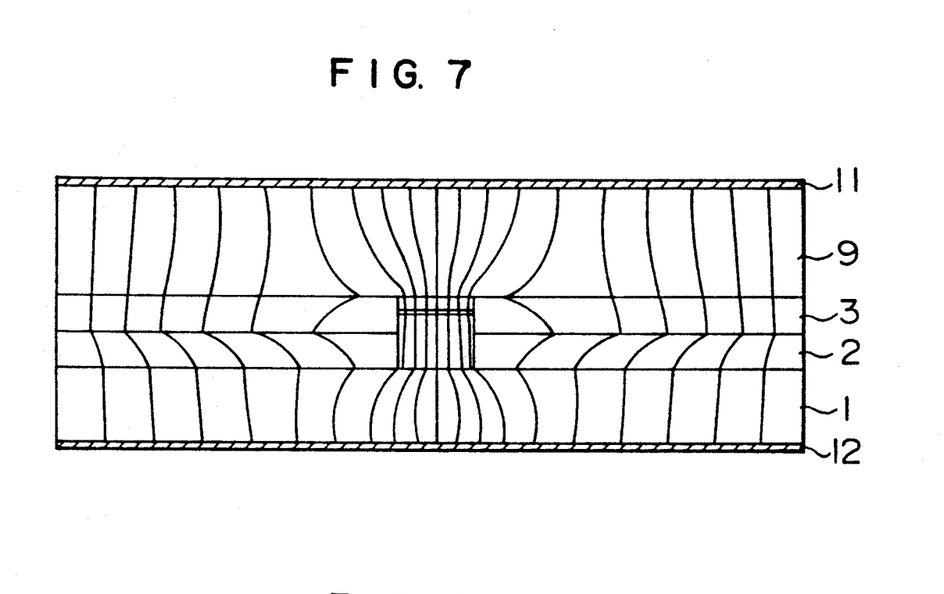
FIG. 7 is a view of current distribution in the conventional BC laser, obtained by computer simulation.
Figure 8:
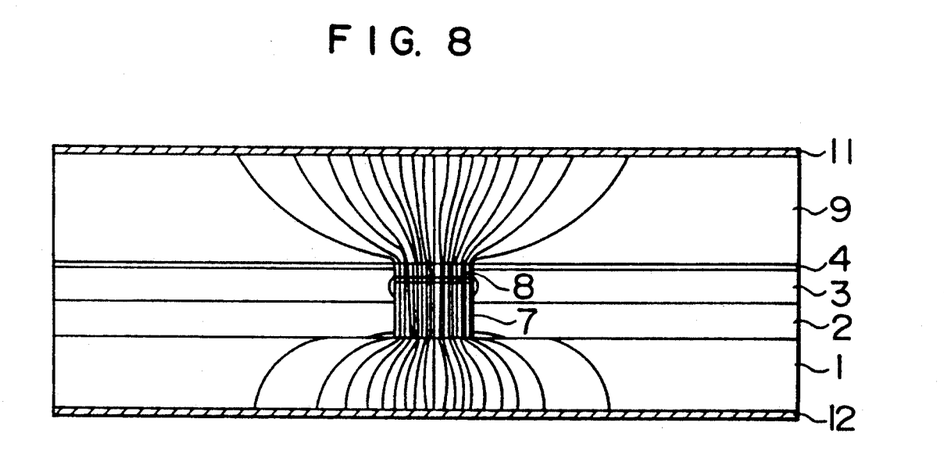
FIG. 8 is a view of current distribution at 85° C. in the semiconductor laser according to the invention, obtained by computer simulation.

Referring to FIGS. 7 and 8, the result of computer simulation indicates that the structure according to the invention is effective for reduction of current leakage. FIG. 7 shows the streamlined current distribution in the conventional BC laser under the conditions of 85° C. and 1.3 V. It is apparent that a large quantity of current leaks to the outside of the active layer. FIG. 8 shows the current distribution in the semiconductor laser according to the invention in the case where the 0.1 μm-thick $In_{0.52}Al_{0.48}As$ current blocking layer 4 is introduced in the semiconductor laser. There is no observation of current leakage under the conditions of a temperature of 85° C., a voltage of 1.3 V and an optical output of 6 mW.

As a resonator structure for feeding back and amplifying light emitted from the active area, according to the present invention, the distributed feedback structure of a diffraction lattice provided in the first semiconductor region may be used or other resonator structures may be used. The shape of the first semiconductor region is not limited to the stripe shape. For example, a so-called surface emitting type structure may be used for reducing the threshold current. In this case, the current blocking region is formed to surround the mesa portion forming a emitting plane.

According to a another aspect of the invention, there is provided a semiconductor laser device further comprising a fourth semiconductor region arranged in an upper portion of the first and second semiconductor regions and having a fourth forbidden band gap which is provided across the first and second semiconductor regions (or so as to cover the first and second semiconductor regions) and which is larger than the first forbidden band gap but smaller than the third forbidden band gap.

According to a further aspect of the invention, there is provided a semiconductor laser device in which the second semiconductor region has a pn junction so that an electric field applied to the second semiconductor region by the pair of electrodes acts as a reverse bias to the pn junction, thereby greatly improving the current blocking effect. By providing the pn junction in the vicinity of the current blocking region (third semiconductor region), the barrier height for blocking the current is increased so that the effect of reduction of leakage current is increased multiplicatively. In particular, it is preferable that the third semiconductor region is formed to have a structure of stacked p-type and n-type semiconductors.

According to a further aspect of the invention, there is provided a semiconductor laser device in which the active area is curved. In particular, it is preferable that the active area is formed to have a buried crescent (BC) structure to thereby attain the objects of the invention more effectively.

According to a further aspect of the invention, there is provided a semiconductor laser device which comprises: a semiconductor substrate; an active area having a first forbidden band gap for emitting light according to an injected electric current; first and second electrodes for injecting an electric current into the active area; first and second cladding areas arranged respectively between the active area and the first electrode and between the active area and the second electrode, the first and second cladding areas having a forbidden band gap larger than the first forbidden band gap; and a wide gap area having a forbidden band gap larger than the forbidden band gap of each of the cladding areas and being provided at one position selected from the position between the first cladding area and the active area and the position between the second cladding area and the active area, whereby the injected electric current is effectively kept in the active area. Such a wide gap area has a tendency to block current injection into the active area. However, the current (injected carriers) once injected into the active area is effectively kept in the active area. As a result, the density of the carriers injected into the active area increases. The first and second cladding areas respectively have first and second conductive types which are different from each other. It is preferable that the conductive type of the wide gap area is adjusted to the first or second cladding area in accordance with the position thereof.

According to a further aspect of the invention, there is provided a semiconductor laser device in which the wide gap area is constituted by a strained layer or a strained-layer superlattice layer having a lattice constant different from that of the semiconductor substrate.

According to a further aspect of the invention, there is provided a semiconductor laser device in which n-type or p-type impurities are introduced into the wide gap area.

According to a further aspect of the invention, there is provided a semiconductor laser device in which the wide gap area has a pn junction so that an electric field applied by the pair of electrodes acts as a reverse bias to said pn junction.

Examples of the semiconductor material having such a larger band gap as to be used in the invention include InGaAlAs, InAlAs, and the like. Examples of the semiconductor material having a lattice contact different from that of InP include InGaAlAs, InAlAs, GaAlAs, and strained-layer superlattice layers formed by using these semiconductor materials. As other materials, InGaAsP, InGaAlAs, InGaP, InAlP and II-VI group semiconductor materials may be used.

An advantage of the present invention is in that a semiconductor laser device with a leakage current being reduced remarkably can be provided.

Another advantage of the invention is that a semiconductor laser device having a high reliability providing stable and efficient oscillation in a remarkably enlarged temperature range suitable for use thereof or regardless of the temperature change in the practical temperature range can be provided.

Other advantages of the invention will be more apparent to those skilled in the art on consideration of the following description of the preferred embodiments thereof.

BRIEF DESCRIPTION OF THE DRAWINGS

The present invention may employ various constituent components and various arrangement of those constituent components. The drawings are not interpreted for limitation of the invention but are used only for description of the preferred embodiments of the invention.

DESCRIPTION OF THE PREFERRED EMBODIMENTS

Embodiment 1

A first embodiment of the present invention will be described with reference to FIG. 1. First, the process of producing a semiconductor laser according to the invention will be described below.

By using an MOCVD method, an n-InP current blocking layer 2 (donor concentration of $N_D=1\times10^{18}cm^{-3}$, thickness of 0.8 μm), a p-InP current blocking layer 3 (acceptor concentration of $N_A=1\times10^{18}cm^{-3}$, thickness of 1.0 μm), a p-In$_{0.52}$Al$_{0.48}$As layer 4 ($N_A=1\times10^{18}cm^{-3}$, thickness of 0.1 μm) and an n-InP layer 5 ($N_D=1\times10^{18}cm^{-3}$, thickness of 0.1 μm) were successively formed on a p-type InP substrate 1. Then, a groove 6 was formed by etching the resulting matter masked an oxidized film to piece the n-InP current blocking layer 2 by using a wet etching method.

Then, a p-InP clad layer 7 ($N_A=1\times10^{18}cm^{-3}$), an undoped InGaAsP active layer 8 (band gap wavelength λg=1.3 μm, center thickness of 0.16 μm) and an n-InP cladding layer 9 ($N_D=1\times10^{18}cm^{-3}$) were successively formed, as shown in FIG. 1, by using a liquid-phase growing method. Then, an SiO$_2$ insulating film 10 was formed by a CVD method. After contact holes were formed, an n-type electrode 11 and a p-type electrode 12 were finally formed by using an evaporating deposition method to thereby prepare a semiconductor laser device as shown in FIG. 1.

In the device of this embodiment, the CW oscillation critical temperature was 170° C. and the efficiency at 100° C. was 0.10 mW/mA. On the contrary, in the conventional device, the CW oscillation critical temperature was about 130° C. and the efficiency at 100° C. was about 0.03 mW/mA. It was apparent that the performance of the device was improved greatly.

Embodiment 2

Figure 9:
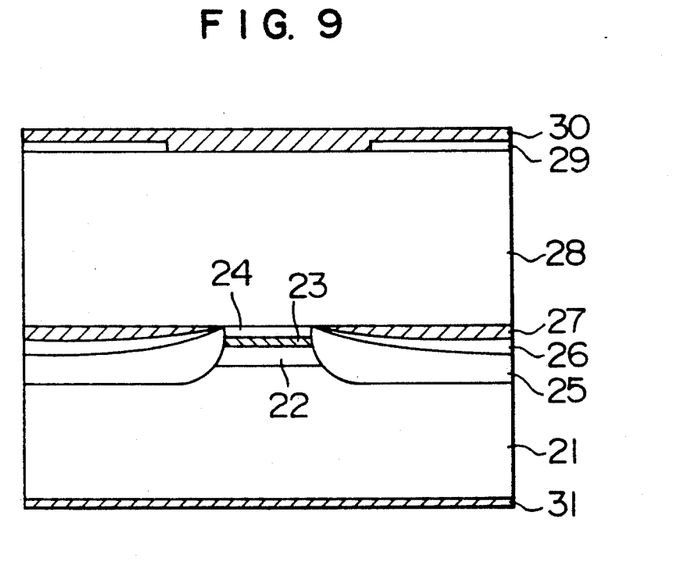

A second embodiment of the invention will be described with reference to FIG. 9. First, a p-InP cladding layer 22 (thickness of 1 μm), an undoped InGaAsP active layer 23 (thickness of 0.14 μm) and an n-InP clad layer 24 (thickness of 0.3 μm) were successively formed on a p-type InP substrate 21 by an MOCVD method. Then, a mesa was formed by a general wet etching method. Then, a p-InP layer 25, an n-InP current blocking layer 26, an n-In$_{0.52}$Al$_{0.48}$As current blocking layer 27 and an n-InP buring layer 28 were successively formed, as shown in FIG. 9, by using a liquid-phase growing method. Then, an SiO$_2$ insulating film 29 was formed by a CVD method. After contact holes were formed, an n-type electrode 30 and a p-type electrode 31 were finally formed by using an evaporating deposition method to thereby prepare a semiconductor laser device as shown in FIG. 9.

In the device of this embodiment, the CW oscillation critical temperature was 160° C. and the efficiency at 100° C. was 0.08 mW/mA.

Embodiment 3

A third embodiment of the invention will be described. This embodiment is substantially the same as the first embodiment (FIG. 1) as to the structure and producing method.

This embodiment has a feature in that the p-$In_{0.52}Al_{0.48}As$ layer 4 used in the first embodiment is replaced by a strained-layer superlattice. The strained-layer superlattice was formed by alternately stacking 5 nm of $In_{0.30}Al_{0.70}As$ and 5 nm of InP by 10 times. Further, the strained-layer superlattice was doped with $1 \times 10^{18} cm^{-3}$ of p-type impurities, uniformly. Besides those points, this embodiment is quite the same as the first embodiment. In this embodiment, the CW oscillation critical temperature was 200° C. and the efficiency at 100° C. was 0.12 mW/mA.

Embodiment 4

Figure 10:
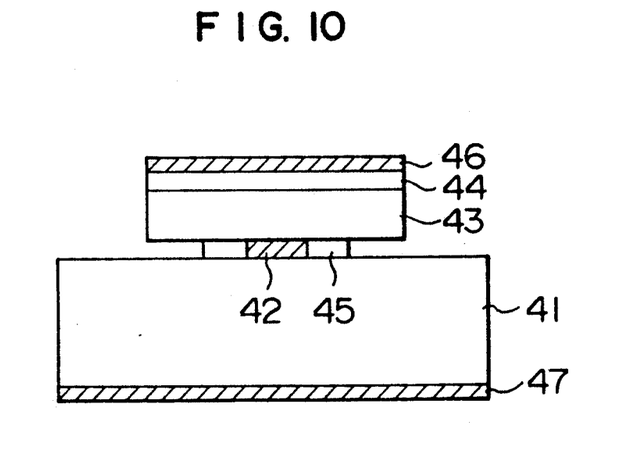
Figure 11A:
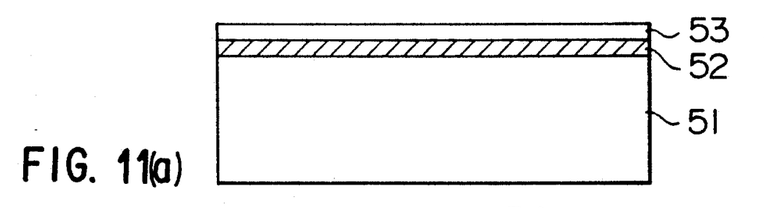
Figure 11B:
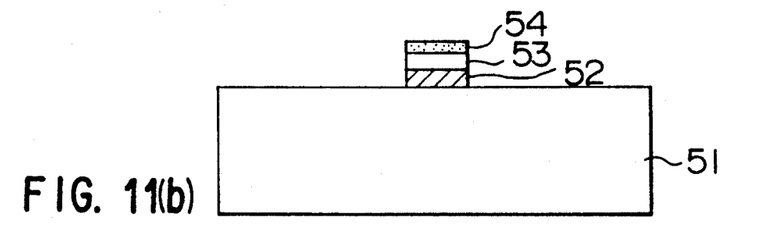
Figure 11C:
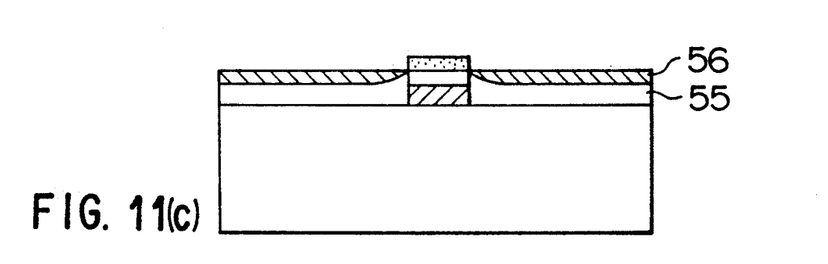
Figure 11D:
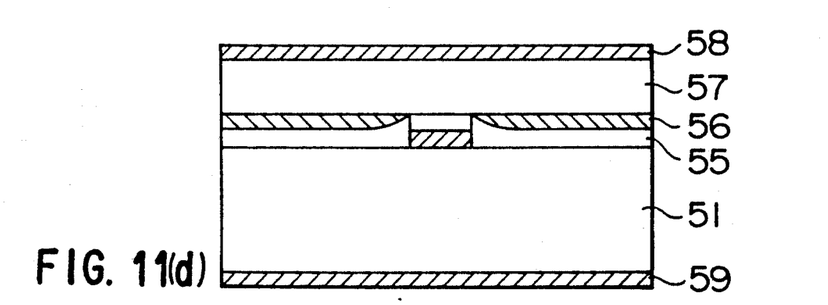

A fourth embodiment of the invention will be described with reference to FIG. 10.

First, the process of producing a semiconductor laser according to the invention will be described below. By using a metal organic chemical vapor deposition (MOCVD) method, an undoped InGaAsP active layer 42 (band gap wavelength of $\lambda g = 1.3$ μm, thickness of 0.15 μm), a p-InP cladding layer 43 (accepter concentration of $1 \times 10^{18} cm^{-3}$, thickness of 1.5 μm) and a p-InGaAsP cap layer 44 ($\lambda g = 1.2$ μm, accepter concentration of $2 \times 10^{18} cm^{-3}$, thickness of 0.5 μm) were successively formed on an n-type InP substrate 41. Then, a mesa with the width of 5 μm was formed by etching the resulting matter masked an oxidized film to pierce the active layer 42 by using a general wet etching method. Then, side-etching was applied to the active layer 42 of InGaAsP selectively by about 2 μm of each side by using a mixture solution of sulfuric acid, hydrogen peroxide and water to thereby reduce the width of the active layer 42 to about 1 μm which is a relatively small value compared with the cladding layer 43. Then, an undoped $In_{0.52}Al_{0.48}As$ inlay layer 45 was formed by using the MOCVD method again to provide widths of 1 μm in the opposite sides of the active layer 42. Finally, a p-type electrode 46 and an n-type electrode 47 were formed by using an evaporating deposition method to thereby prepare a semiconductor laser device in this embodiment. In this embodiment, the differential efficiency with respect to light from the front facet at 50° C. was 0.20 mW/mA and a bandwidth of 10 GHz was obtained in the optical output of 10 mW at 50° C.

Embodiment 5

A fifth embodiment of the invention will be described with reference to FIGS. 11(a)–11(d). First, the process of producing a semiconductor laser according to the invention will be described below.

By using an MOCVD method, an undoped InGaAsP active layer 52 (thickness of 0.1 μm, band gap wavelength of $\lambda g = 1.53$ μm) and an updoped InGaAsP optical guide layer 53 (thickness of 0.1 μm, band gap wavelength of 1.27 μm) were successively formed on a p-type InP substrate 51. Then, a general wet etching method was applied to the resulting matter masked with an oxidized film 54, so that the optical guide layer 53 and the active layer 52 of InGaAsP were selectively etched to reduce the width of the active layer 52 to about 1 μm. Then, by using the MOCVD method again, a p-type InP (accepter concentration of $1 \times 10^{17} cm^{-3}$) layer 55 and an $In_{0.7}Ga_{0.3}P$ layer (thickness of 40 Å) 56 were formed so as to be almost flat in the opposite sides of the mesa stripe. Then, after the oxidized film 54 was removed, an n-InP clad layer 57 (donor concentration of $7 \times 10^{17} cm^{-3}$, thickness of 2 μm) was formed by the MOCVD method. Finally, an n-type electrode 58 and a p-type electrode 59 were formed by an evaporating deposition method to thereby prepare a semiconductor laser in this embodiment. In this embodiment, the CW oscillation critical temperature was 140° C. and the efficiency at 100° C. was 0.06 mW/mA.

Embodiment 6

A sixth embodiment of the invention will be described. This embodiment is substantially the same as the fifth embodiment (FIGS. 11(a)–11(d) as to the structure and producing method.

This embodiment has a feature in that the InGaP current blocking layer 56 used in the fifth embodiment is replaced by a double-layer structure of $In_{0.4}Al_{0.6}As$ (thickness of 100 Å) and n-InP (thickness of 500 Å) (in which $In_{0.4}Al_{0.6}As$ grows before n-InP). Besides the aforementioned point, this embodiment is quite the same as the fifth embodiment. In this embodiment, the CW oscillation critical temperature was 200° C. and the efficiency at 100° C. was 0.13 mW/mA.

Embodiment 7

A seventh embodiment of the invention will be described. This embodiment is substantially the same as the fifth embodiment (FIGS. 11(a)–11(d) as to the structure and producing method.

This embodiment has a feature in that the InGaP current blocking layer 56 used in the fifth embodiment is replaced by ZnSeTe lattice-matched with InP. Besides the aforementioned point, this embodiment is quite the same as the fifth embodiment. In this embodiment, the CW oscillation critical temperature was 200° C. and the efficiency at 100° C. was 0.12 mW/mA. Although this embodiment has shown the case where ZnSeTe is used, the invention can be applied to the case where II–VI group semiconductors such as ZeSTe, CdSeTe and CdSTe may be used. Although this embodiment has shown the case where ZnSeTe is lattice-matched with InP, it is a matter of course that the invention can be applied to the case where the semiconductor is not always lattice-matched with InP and that the semiconductor may be formed like a strained layer or a strained-layer superlattice.

Embodiment 8

Figure 12:
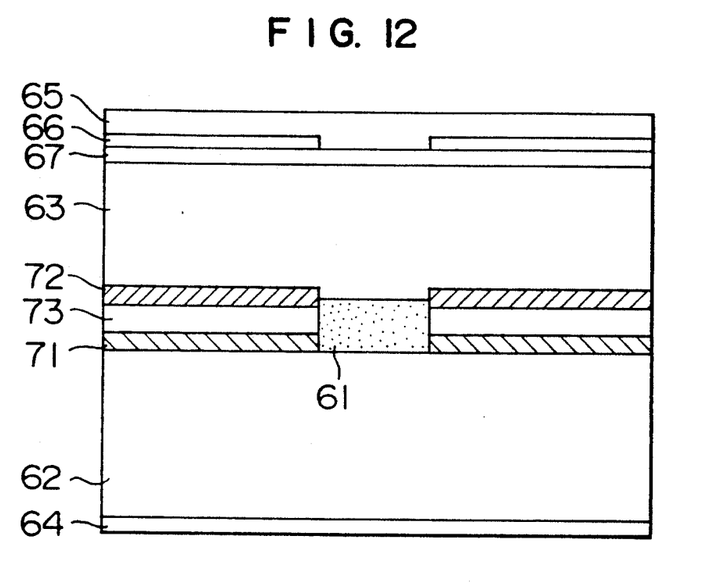

An eighth embodiment will be described with reference to FIG. 12 which is a sectional view of a semiconductor laser. First, a process of producing the semiconductor laser will be described below. An optical waveguide layer 61 containing an active layer of InGaAsP was formed on an n-type InP substrate 62 by crystal growing. For example, the optical waveguide layer 61 comprises a 0.15 μm-thick InGaAsP layer with the absorption edge wavelength of 1.3 μm, a 0.15 μm-thick InGaAsP layer with the absorption edge wavelength of 1.5 μm, and a 0.15 μm-thick InGaAsP layer with the absorption edge wavelength of 1.3 μm. An $SiO_2$ protective film was put on the optical waveguide layer 61 and then a photoresist was patterned thereon. A 1 μm-wide $SiO_2$ stripe was left by etching with an etching solution of fluoric acid. The optical waveguide layer 61 of InGaAsP masked with $SiO_2$ was etched with an etching solution of sulfuric acid so that the layer 61 was removed to reach the surface of the substrate. While the mask of $SiO_2$ was left, a 0.015 μm-thick InGaP layer 71 containing Zn as p-type impurity and having a forbidden band gap wider than that of InP by 0.1 eV, a 0.4 μm-thick InP layer 73 having a low p-type impurity concentration of about $1\times10^{17}$cm$^{-3}$ and a 0.015 μm-thick InGaP layer 72 containing Se as n-type impurity were formed on an area except the SiO$_2$ mask by crystal growing according to an organic metal vapor-phase growing method (MOVPE method). Then, the SiO$_2$ mask was removed, so that a p-type InP cladding layer 63 and an InGaAsP layer 67 having an absorption edge wavelength of 1.15 μm were formed on the whole surface thereof by crystal growing. If not described specifically, the p-type or n-type impurity concentration in the respective layer was about $1\times10^{18}$cm$^{-3}$. After an SiO$_2$ insulating film 66 was patterned and then Zn was diffused in to the window portion, a p-electrode and an n-electrode were formed by evaporating deposition.

The refractive index of each of the InGaP barrier layers 71 and 72 with respect to the oscillation wavelength 1.54 μm of the laser becomes smaller than that of InP. However, there is no occurrence of large strain (distortion) in electric field distribution based on the optical influence compared with the conventional inlay region of InP, because the thickness of each of the InGaP barrier layers 71 and 72 is very small as about 0.013 μm.

By using barriers having reverse electroconductive properties in combination as described above in this embodiment, laser oscillation can be obtained easily even at 100° C. or higher temperature.

Embodiment 9

Figure 13:
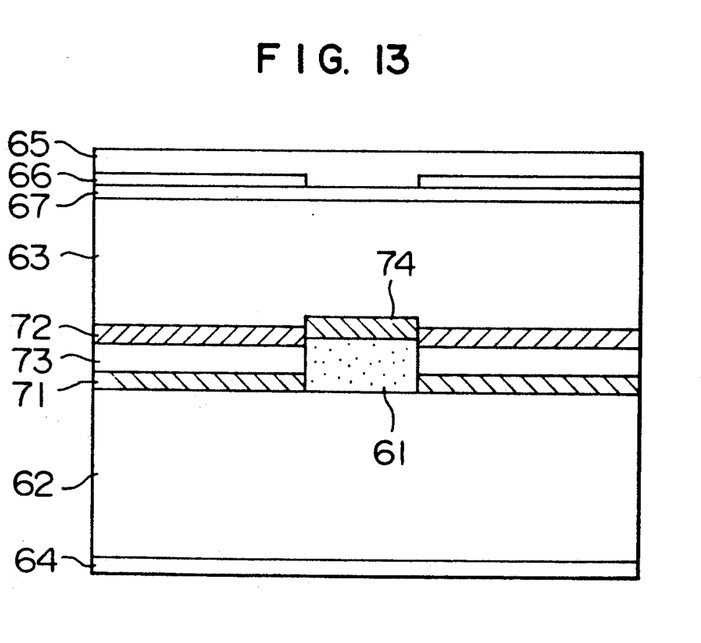

A ninth embodiment will be described with reference to FIG. 13 which is a sectional view of a semiconductor laser. In the structure of FIG. 13, a 0.015 μm-thick InGaP barrier layer 74 containing $1\times10^{18}$cm$^{-3}$ of Zn as p-type impurity is formed on the optical waveguide layer 61 having the structure of FIG. 12 by crystal growing simultaneously to the crystal growing of the active layer. By providing the barrier layer 74, electron leakage to p-type InP can be reduced. Accordingly, current-optical output conversion efficiency at 100° C. is improved. Accordingly, laser oscillation more stable at high temperature can be obtained.

Further, an InGaP barrier layer containing about $1\times10^{18}$cm$^{-3}$ of Se as n-type impurity may be provided between the optical waveguide layer 61 and the n-type InP substrate in FIG. 13 to prevent hole leakage to the n-type InP substrate. Accordingly, the performance of the device at high temperature can be improved more greatly.

The invention is useful to other structures than the afore-mentioned structure. For example, a semiconductor or strained-layer superlattice having a forbidden band gap wider than that of the substrate can be used not only in a part of the p-type current blocking layer but in the whole of the p-type current blocking layer or the semiconductor of strained-layer super-lattice can be used in a part of the n-type current blocking layer or in the whole thereof. Further, the respective current blocking layer may be constituted by an undoped material or may be constituted by a semi-insulating material (Fe-doped material or the like). In any case, the effect of the current blocking layer can be obtained.

Although this embodiment has shown the case where the substrate is of n type, the invention can be applied to the case where a p-type or semi-insulating substrate may be used and electrodes are arranged in the upper portion thereof.

Further, the invention can be applied to semiconductor devices having a current blocking structure (current-confinement structure), such as a distributed feedback (DFB) laser, a Bragg reflection (DBR) laser, a wavelength tunable laser, an external cavity type laser, a vertical cavity type surface emitting laser, a light-emitting diode, an optical modulator, an optical switch, and the like.

In addition, it is to be understood that the wavelength is not limited to 1.3 μm and that the invention can be applied to all materials in the range of wavelength oscillated by the semiconductor laser.

What is claimed is:

1. A semiconductor laser device comprising:
   a semiconductor substrate;
   a first semiconductor region being disposed on the semiconductor substrate and including an active region which has a first forbidden band gap for emitting light according to an injected electric current:
   a second semiconductor region being disposed in the vicinity of said first semiconductor region and above said semiconductor substrate, having a smaller refractive index than that of said active region to confine the light emitted from said active region in the vicinity of the active region, and having a second forbidden band gap larger than said first forbidden band gap: and
   a pair of electrodes for injecting said electric current into said first semiconductor region
   wherein said second semiconductor region includes a third semiconductor region for preventing said injected electric current from passing through said second semiconductor region, said third semiconductor region having a third forbidden band gap larger than said second forbidden band gap and being substantially flat, said second semiconductor region also including a pn junction so that an electric field applied by said pair of electrodes acts as a reverse bias to said pn junction.

2. A semiconductor laser device according to claim 1, in which said third semiconductor region is formed of a semiconductor material having a lattice constant different from a lattice constant of said semiconductor substrate.

3. A semiconductor laser device according to claim 1, further comprising a distributed feedback structure in the vicinity of said first semiconductor region.

4. A semiconductor laser device according to claim 1, further comprising a surface emitting type vertical cavity.

5. A semiconductor laser device according to claim 1, further comprising a fourth semiconductor region disposed above said first and second semiconductor regions and having a fourth forbidden band gap which is provided across said first and second semiconductor regions and which is larger than said first forbidden band gap but smaller than said third forbidden band gap.

6. A semiconductor laser device according to claim 1, in which said third semiconductor region is formed to have a structure in which p-type and n-type semiconductors are stacked.

7. A semiconductor laser device according to claim 1, in which said active area is curved.

8. A semiconductor laser according to claim 1, further comprising: a fifth semiconductor region being disposed in the vicinity of the first semiconductor region and above said semiconductor substrate such that said second and fifth semiconductor regions border said first semiconductor region.

9. A semiconductor laser device comprising:
   a semiconductor substrate;
   a first semiconductor region being disposed on said semiconductor substrate and including an active region which has a first forbidden band gap for emitting light according to an injected electric current;
   a second semiconductor region being disposed in the vicinity of said first semiconductor region and above the semiconductor substrate, having a smaller refractive index than that of said active region to confine the light emitted from the active region in the vicinity of said active region, and having a second forbidden band gap larger than said first forbidden band gap:
   a pair of electrodes for injecting an electric current into said first semiconductor region;
   a third semiconductor region for preventing said injected electric current from passing through said second semiconductor region, said third semiconductor region having a third forbidden band gap larger than said second forbidden band gap and being formed so as to be apart from said active area;
   wherein said second semiconductor region includes a pn junction so that an electron field applied by the pair of electrodes acts as a reverse bias to the pn junction.

10. A semiconductor laser device according to claim 9, in which said third semiconductor region is formed of a semiconductor material having a lattice constant different from a lattice constant of the semiconductor substrate.

11. A semiconductor laser device according the claim 9, further comprising a distributed feedback structure in the vicinity of said first semiconductor region.

12. A semiconductor laser device according to claim 9, further comprising a surface emitting type vertical cavity.

13. A semiconductor laser device according to claim 9, further comprising a fourth semiconductor region disposed above said first and second semiconductor regions and having a fourth forbidden band gap which is provided across said first and second semiconductor regions and which is larger than said first forbidden band gap but smaller than said third forbidden band gap.

14. A semiconductor laser device according to claim 9, in which said third semiconductor region is formed to have a structure in which p-type and n-type semiconductors are stacked.

15. A semiconductor laser device according to claim 9, in which said active area is curved.

16. A semiconductor laser according to claim 9, further comprising: a fifth semiconductor region being disposed in the vicinity of the first semiconductor region and above said semiconductor substrate such that said second and fifth semiconductor regions border said first semiconductor region.

17. A semiconductor laser device comprising:
    a semiconductor substrate;
    an active area having a first forbidden band gap for emitting light according to an injected electric current;
    first and second electrodes which inject an electric current into said active area;
    first and second cladding areas arranged respectively between said active area and said first electrode and between said active area and said second electrode, said first and second cladding areas having a forbidden band gap larger than said first forbidden band gap; and
    a first wide gap region having a forbidden band gap larger than said forbidden band gap of each of said cladding areas and being disposed either between said first cladding layer and said active layer or between said second cladding area and said active area, whereby said injected electric current is effectively kept in said active area, said first wide gap region having a pn junction so that an electric field applied by said first and second electrodes acts as a reverse bias to said pn junction.

18. A semiconductor laser according to claim 17, further comprising: a second wide gap region having a forbidden band gap larger than said forbidden band gap of each of said cladding areas and being disposed on the side of said active area opposite said first wide gap region, between said active area and the corresponding cladding area, whereby said injected electric current is effectively kept in said active area, said second wide gap region having a pn junction so that an electric field applied by said first and second electrodes acts as a reverse bias to said pn junction.

19. A semiconductor laser device according to claim 18, in which said first and second cladding areas respectively have first and second conductive types which are different from each other.

20. A semiconductor laser device according to claim 18, in which said wide gap area is constituted by a strained layer or a strained-layer superlattice having a lattice constant different from that of said semiconductor substrate.

21. A semiconductor laser device according to claim 18, in which n-type or p-type impurities are introduced into said wide gap area.

* * * * *

UNITED STATES PATENT AND TRADEMARK OFFICE
CERTIFICATE OF CORRECTION

PATENT NO. : 5,170,404

DATED : December 8, 1992

INVENTOR(S) : Tsukuru Ohtoshi et al

Page 1 of 2

It is certified that error appears in the above-indentified patent and that said Letters Patent is hereby corrected as shown below:

Title Page item [57]:
In the Abstract, line 1, after "disclosed" change "in" to -- is --.

| Column | Line | |
|---|---|---|
| 1 | 28-29 | Change "JP-A-51-13588." to -- (JP-A-51-13588). -- . |
| 3 | 9 | Change "$Al_xGa_{1-x)y}$..." to -- $Al_xGa_{1-x})_y$... --. |
| 3 | 24 | After "greatly" insert -- , --. |
| 4 | 14 | Before "another" delete "a". |
| 4 | 17 | After "areas" insert -- , --; after "respectively" insert -- , --. |
| 5 | 44 | Change "arrangement" to -- arrangements --. |
| 5 | 46 | After "invention" insert -- , --. |
| 6 | 16 | Change "$N_A$-1..." to -- $N_A$=1... --. |
| 6 | 21 | After "masked" insert -- with --. |
| 6 | 54 | Change "buring layer" to -- burning layer --. |
| 7 | 29 | After "masked" insert -- with --. |
| 7 | 35 | After "$1\mu m$" insert -- , --. |

UNITED STATES PATENT AND TRADEMARK OFFICE
CERTIFICATE OF CORRECTION

PATENT NO. : 5,170,404
DATED : December 8, 1992
INVENTOR(S) : Tsukuru Ohtoshi et al It is certified that error appears in the above-indentified patent and that said Letters Patent is hereby corrected as shown below:

| Column | Line | |
|---|---|---|
| 9 | 15 | Change "in to" in -- into --. |
| 9 | 24 | After "small" insert -- , --. |
| 9 | 65 | Change "of n type" to -- of an n-type --. |
| 10 | 6 | Change "cavity type" to -- cavity-type --. |
| 11 | 38 | After "according" change "the" to -- to --. |

Signed and Sealed this

First Day of February, 1994

Attest:

BRUCE LEHMAN

*Attesting Officer*     Commissioner of Patents and Trademarks